United States Patent
Stoemmer

(10) Patent No.: US 7,230,509 B2
(45) Date of Patent: Jun. 12, 2007

(54) ACOUSTIC MIRROR

(75) Inventor: Ralph Stoemmer, Neubiberg (DE)

(73) Assignee: Epcos AG, Munich (DE)

( * ) Notice: Subject to any disclaimer, the term of this patent is extended or adjusted under 35 U.S.C. 154(b) by 102 days.

(21) Appl. No.: 10/498,203

(22) PCT Filed: Dec. 6, 2002

(86) PCT No.: PCT/DE02/04498

§ 371 (c)(1),
(2), (4) Date: Jun. 9, 2004

(87) PCT Pub. No.: WO03/050950

PCT Pub. Date: Jun. 19, 2003

(65) Prior Publication Data
US 2005/0068124 A1 Mar. 31, 2005

(30) Foreign Application Priority Data
Dec. 11, 2001 (DE) .................... 101 60 617

(51) Int. Cl.
H03H 9/70 (2006.01)
H03H 9/54 (2006.01)

(52) U.S. Cl. ............. 333/133; 333/187; 333/189; 310/322; 310/335

(58) Field of Classification Search ........... 333/133, 333/187, 189; 310/335
See application file for complete search history.

(56) References Cited

U.S. PATENT DOCUMENTS

| 5,873,154 | A | 2/1999 | Ylilammi et al. | |
|---|---|---|---|---|
| 5,910,756 | A | 6/1999 | Ella | 333/133 |
| 6,407,649 | B1* | 6/2002 | Tikka et al. | 333/133 |
| 6,466,105 | B1 | 10/2002 | Lobl | 333/187 |
| 6,472,954 | B1* | 10/2002 | Ruby et al. | 333/133 |
| 6,542,055 | B1 | 4/2003 | Frank et al. | 333/189 |
| 6,603,241 | B1 | 8/2003 | Barber et al. | 310/335 |
| 6,741,145 | B2* | 5/2004 | Tikka et al. | 333/133 |
| 6,794,285 | B2* | 9/2004 | Matsui et al. | 438/633 |

(Continued)

FOREIGN PATENT DOCUMENTS

EP 1 067 685 1/2001

(Continued)

OTHER PUBLICATIONS

Lee U.Y. et al: "The Properties of Electrical Conduction and Photoconduction in Polyphenylene Sulfide by Uniaxial Elongation" 1998 IEEE 6th Intl Conf on Conduction and Breakdown in Solid Dielectrics, Jun. 22-25, 1998, Vasteras, Sweden pp. 241-244.

(Continued)

*Primary Examiner*—Barbara Summons
(74) *Attorney, Agent, or Firm*—Fish & Richardson P.C.

(57) ABSTRACT

An acoustic mirror includes constituent layers that are substantially odd multiples of λ/4. The constituent layers include a first impedance layer and a second impedance layer, where the first impedance layer includes a first material having a first acoustic impedance and a first dielectric constant, and the second impedance layer includes a second material having a second acoustic impedance and a second dielectric constant. The second acoustic impedance is higher than the first acoustic impedance, and the first dielectric constant is lower than the second dielectric constant.

20 Claims, 6 Drawing Sheets

U.S. PATENT DOCUMENTS

| | | | |
|---|---|---|---|
| 2001/0028285 A1* | 10/2001 | Klee et al. | 333/188 |
| 2003/0000058 A1* | 1/2003 | Tsai et al. | 29/25.35 |
| 2005/0227451 A1* | 10/2005 | Konno et al. | 438/424 |

FOREIGN PATENT DOCUMENTS

| | | |
|---|---|---|
| EP | 1 158 671 | 11/2001 |

OTHER PUBLICATIONS

Peters L.: "Pursuing the Perfect Low-K Dielectric", Semiconductor International, Sep. 10, 1998, XP-000951575.

Martin S.J. et al.: "Development of a Low-Dielectric-Constant Polymer for the Fabrication of Integrated Circuit Interconnect", Advanced Materials, Bd. 12, Nr. 23, Dec. 1, 2000, pp. 1769-1778 XP-000977267.

K. M. Lakin et al. "High Performance Stacked Crystal Filters for GPS and Wide Bandwidth Applications"; IEEE 2001 Ultrasonic Symposium, paper 3E-6, Oct. 9, 2001, pp. 833-838.

K. M. Lakin "Development of Miniature Filters for Wireless Application" IEEE 1995 MTT-D Digest, pp. 883-886, May 1995.

J. H. Golden "Designing Porous Low-k Dielectrics" Semiconductor International; May 2001.

R. D. Goldblatt "A High Performance 0.13 pm Copper BEOL Technolog with Low-k Dielectric" Proceedings if the IEEE 2000 IITC pp. 261-263, Jun. 2000.

Processing Procedures for Dry-Etch CYCLOTENE Advanced Electronics Resins (Dry-Etch BCB); Cyclotene, Processing Procedures, pp. 1-8, Dow Chemical Company, Nov. 1997.

* cited by examiner

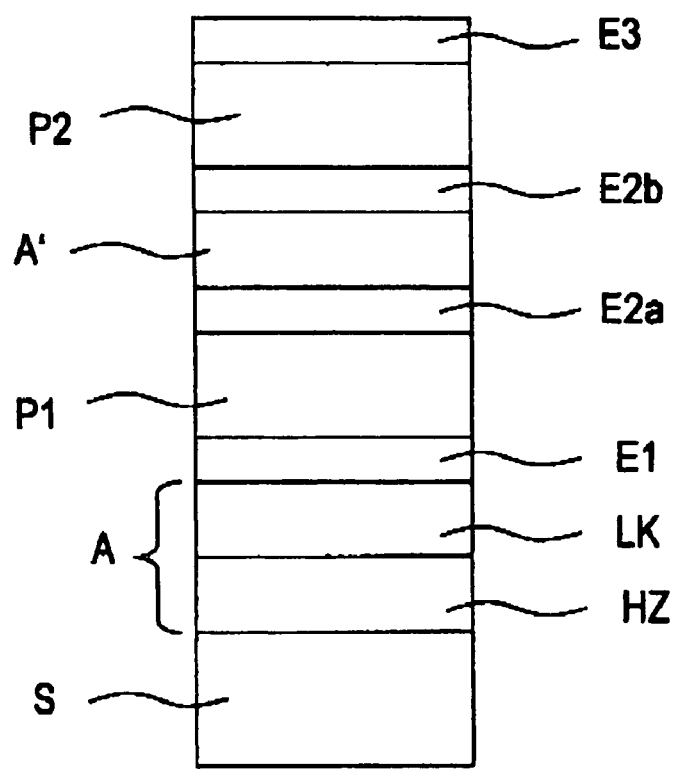

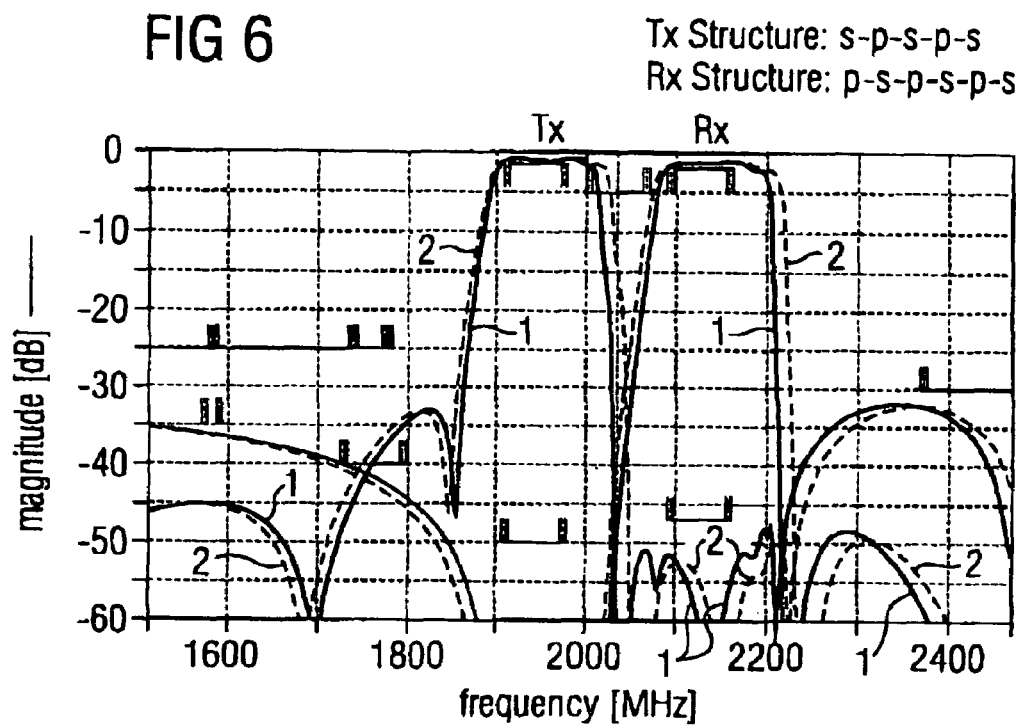
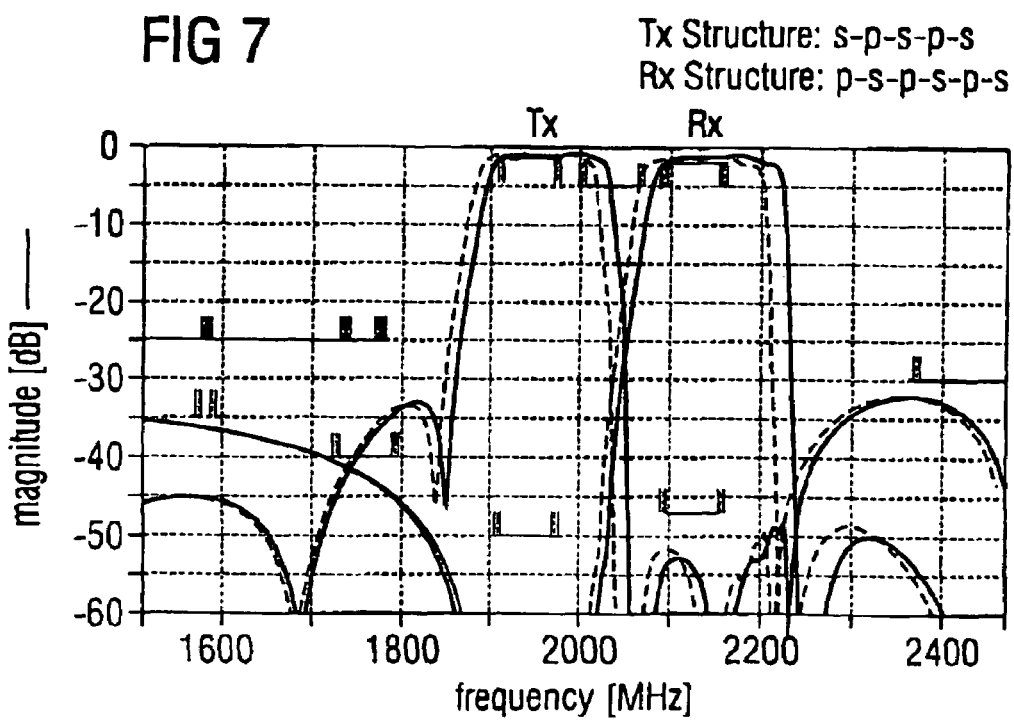

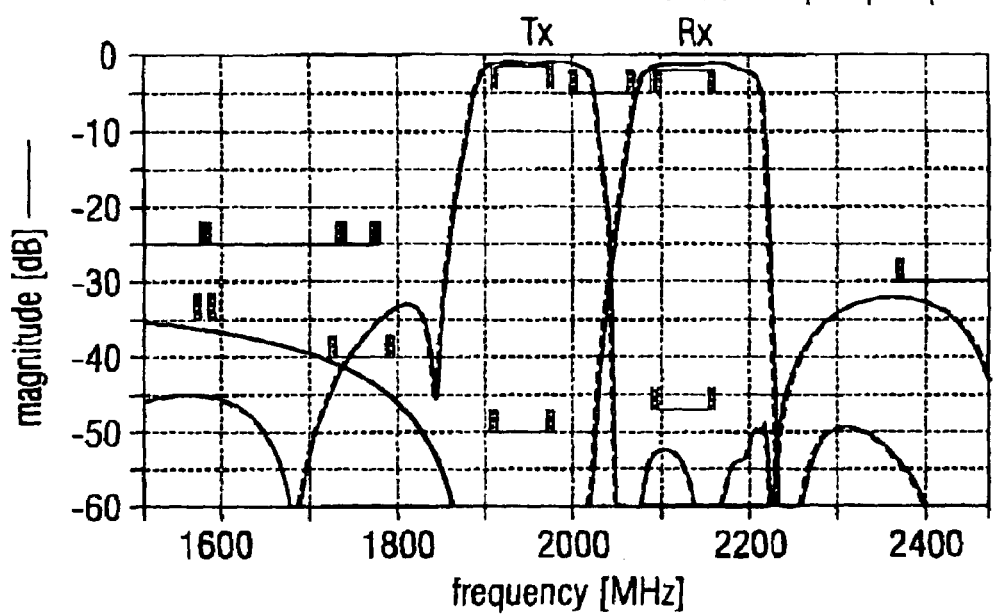

ACOUSTIC MIRROR

TECHNICAL FIELD

This application relates to an acoustic mirror for a bulk acoustic wave resonator (BAW resonator) and a stacked-crystal filter (SCF) with at least one pair of layers that are $\lambda/4$ or $3\lambda/4$ layers, where each pair of layers includes a first layer with a first material of high acoustic impedance and a second layer with a second material of relatively lower acoustic impedance.

BACKGROUND

Volume oscillators—FBARs (thin-film bulk acoustic resonators) or bulk acoustic wave (BAW) resonators that work with acoustic waves—are based on a piezoelectric base body that is on each of the two main surfaces with an electrode. Such a resonator has a resonance frequency fr that depends on the total thickness $L_0$ of the oscillating base body approximately in accordance with the formula $$fr = v/2L_0$$

Here, v denotes the velocity of longitudinal waves in the piezoelectric base body. Such resonators can be used, for example, to construct HF (high frequency) filters. In addition, several such resonators can be connected in branching circuits into a filter network, a so-called reactance filter.

The required layer thickness $L_0$ for a resonating BAW resonator in the HF range is in the μm and sub-μm range. Thin-layer processes are therefore required for the production of the layers of the base body.

In order to keep the energy of the acoustic waves inside the base body of the resonator, and to provide a sharp resonance frequency for the resonator, two main construction principles are known that make sufficiently high reflection of the acoustic waves possible at boundaries in order to provide an adequate filtering effect with low acoustic or electrical losses.

One possibility for keeping the energy of the acoustic waves within the base body of the resonator comprises arranging the base body over a hollow space, in which case a membrane can also be arranged between the lower electrode and the substrate. This arrangement is also called a bridge-type resonator.

Other BAW resonators of the mirror type use a so-called acoustic mirror. This type includes a number of layer pairs with alternating layers of materials with higher and lower acoustic impedance. Each of the layers has a layer thickness of one quarter lambda ($\lambda/4$) so that at each boundary reflected wave portions are superimposed constructively. In principle, in selecting the layer thicknesses, values would also be possible that correspond to odd multiples of quarter lambdas, thus $\lambda/4$, $3\lambda/4$, ... $(2n-1)\lambda/4$, with natural numbers n. To optimize resonator characteristics, mirror-layer thickness can deviate slightly form the $\lambda/4$, $3\lambda/4$, ... $(2n-1)\lambda/4$ rule. $SiO_2$ is used in particular as a material with lower acoustic impedance. A heavy metal such as tungsten or molybdenum, or aluminum nitride, is used as a material with higher acoustic impedance. The higher the impedance difference between the two materials, the fewer pairs are used for an acoustic mirror. Some acoustic mirrors need at least two $\lambda/4$ layer pairs between the lower electrode and the substrate. With each additional layer, however, the effective coupling of the resonator, and thus the bandwidth, is reduced. In contrast to a resonator of the bridge type, the bandwidth of the resonator can be reduced by up to 30% in this case. With such resonators, it is therefore significantly more expensive to construct a band-pass filter with adequate bandwidth.

Another disadvantage of a BAW resonator of the mirror type is in the complexity of the process for depositing and structuring the multilayer structure required for it. Each $\lambda/4$ layer increases the complexity, and thus the cost, of the production process. With the number of necessary layers, errors also become more frequent so that a significant scattering of resonance frequencies of the resonators over an entire wafer and, as a result, the average frequency of filters must be taken into account.

Since the bandwidth of the acoustic mirror is reduced as the number of layer pairs for the acoustic mirror increases, in a duplexer, for example, that has two filters with different passage ranges (pass bands), a separate acoustic mirror would be required for each of the two filters. The complexity of production is thereby increased.

Layers with high dielectric constants, such as the metal tungsten and molybdenum in particular, can result in coupling of electric signals to the substrate, which results in undesired speech overlap and an increase in insertion loss.

SUMMARY

This application describes making an acoustic mirror out of at least one pair of layers of materials with different acoustic impedances, such that a low-k dielectric is chosen as a material with lower acoustic impedance. If such a dielectric is combined with another layer of a material with high acoustic impedance, then a highly reflective acoustic mirror is obtained. Material combinations for the mirror-layer pair have been found that make possible a highly reflecting mirror even with only one pair of layers.

The low-k dielectrics used are known as insulation, covering, and intermediate layers for microelectronic applications. This class of materials, the low-k dielectrics include hardened foams, porous oxides, and aerogels, as well as networked hardened polymers and other organic materials that can deposited by the CVD (chemical vapor deposition) technique or the SOD (spin-on deposition) technique. These materials have a lower dielectric constant than $SiO_2$ and have an $\epsilon$ less than 3. In addition, they have even lower densities, $\rho$, and small elastic constants, c. Since the acoustic impedance, Z, is calculated according to the formula $$z = \sqrt{\rho * c}$$

extremely low acoustic impedances result with these two low values, c and $\rho$, which, in combination with materials of high impedance, Z, give the highly reflective acoustic mirror. In combination with tungsten as a high-impedance material, the reflectivity of a single $\lambda/4$ layer pair is sufficient to produce a good acoustic mirror for a BAW resonator. By $\lambda/4$ layer pair, layer pairs with layer thickness of odd multiples of $\lambda/4$ are also to be understood, as well as layers that deviate slightly from this value. The acoustic reflectivity at the boundaries between the lower electrode and the low-k dielectric alone is over 90% when gold is chosen as the material for the lower electrode. When the conventional material $SiO_2$ is used, the acoustic reflection at the boundary between the gold and the low-k material is only 40%. Here, the acoustic reflectivity, R, at the boundary between two layers, 1 and 2, is calculated according to the formula $$R = \left|\frac{Z_1 - Z_2}{Z_1 + Z_2}\right|^2$$

$Z_1$ corresponds to the acoustic impedance of gold ($Z^{Au}=63*10^6$ kg/s/m$^2$) and $Z_2$ corresponds to the acoustic impedance of the low-k dielectric used (as an example for the low-k dielectrics SiLK® and BCB: $Z_{low-k}<2*10^6$ kg/m/m$^2$) or the acoustic impedance of SiO$_2$ ($Z_{SiO2}=14*10^6$ kg/s/m$^2$).

Since the acoustic impedance of a material rises or falls with its density, steps can be taken to reduce the low acoustic impedance in the layers even further. It is advantageous, for example, to provide nanopores in the mirror layer with lower acoustic impedance. Such nanopores can be determined structurally in appropriate polymers or be present in a material with a 3D structure. Nanopores can also be generated later, however, for example by foaming the material with a gas-releasing substance, especially with a propellant. Siloxanes as well that are derived from silsesquioxanes have structurally determined hollow spaces that reduce the density and thereby the acoustic impedance. Materials like aerogels or porous silicates likewise have pores and thereby a lower density.

Low-k dielectrics that may be used with the acoustic mirror described herein include polyaromatic polymers derived, for example, by polymerization of monomers of polyphenylene or bis-benzocyclobutene substituted with cyclopentadienone and acetylene. By means of the polymerization, for example, networked polyphenylene (trade name SiLK®) or networked bis-benzocyclobutene (trade name BCB) is obtained that has, for the example of BCB, a glass-transition temperature (maximum temperature stability) of more than 350° C., an elastic constant of about 2 GPa, an average density of 1.0 g/cm$^3$, and thereby an acoustic impedance of only 1.4×10$^6$ kg/s/m$^2$. The low-k dielectric SiLK has a glass-transition temperature (maximum temperature stability) of more than 490° C., an elastic constant of about 2.45 GPa, an average density of 1.2 g/cm$^3$, and an acoustic impedance of only 1.7×10$^6$ kg/s/m$^2$.

Commercial polymers on this basis are known, for example, from an article by S. J. Martin et al.: "Development of a Low-dielectric-constant Polymer for the Fabrication of Integrated Circuit Interconnect" in *Adv. Mater.* 2000, 12, No. 23, December 1, pages 1769-1778, and are also commercially available. The elastic constant of this material is in the GPa range and thus is an order of magnitude below the elastic constant of SiO$_2$, which has been used so far as the low-impedance layer. Since the density of this material is also lower than that of SiO$_2$, extremely low acoustic impedance results.

The high thermal stability of this material is most suitable for making subsequent layer deposition of additional functional layers possible, such as, for example, another high-impedance layer, piezoelectric layers, electrodes, diffusion barriers, or passivation, even at the high temperatures required for this. They can be applied in very homogeneous layer structures by the spin-on technique, in which a desired layer thickness can be set with high precision. With a mirror-layer pair that includes such a polyaromatic layer, coupling in the BAW resonator is increased. With this, the bandwidth in the BAW filter is also raised by an average of 14% with respect to conventional acoustic mirrors. In this way, a BAW resonator with an acoustic mirror becomes a fully equivalent alternative to a BAW resonator with a bridge structure.

The process costs in the production of a BAW resonator or even in the reduction of an acoustic mirror for a BAW resonator are reduced by a reduction in the number of mirror layers needed. For a layer pair of tungsten/polyaromatic low-k dielectric, only a single layer pair is required.

By reducing the number of mirror layers, the diffusion of the average frequency over all resonators manufactured on a single wafer is reduced. In addition, the interrupting electric coupling to the substrate, caused especially by the use of metallic high-impedance layers in the acoustic mirror, is reduced by reducing the number of layers in the mirror and by reducing the relative dielectric constant of the low-k dielectric.

Another material besides SiLK® with a low dielectric constant, low density, and a small elastic constant c, is benzocyclobutene. This material is known as a dielectric in microelectronics by its abbreviation, BCB, and as an insulating and covering layer. It is also extremely well-suited for acoustic-mirror layers with low acoustic impedance, since it also provides and achieves a highly homogeneous layer thickness during application and can be applied to a substrate reproducibly in a desired thickness, for example by the spin-on technique.

The acoustic mirror described herein has application in a BAW resonator, in which the layer of higher acoustic impedance, for example tungsten, is applied directly onto a material acting as the carrier, onto which the layer of lower acoustic impedance, for example a polyaromatic compounds, such as SiLK® or BCB, or another low-k dielectric is applied, and onto that a resonator including a first electrode, a piezoelectric layer, and an upper second electrode are applied. Glass, ceramics or semiconductors, for example, are suitable as substrate materials. It is also possible to use a multilayer substrate, in which individual layers or the entire substrate can also comprise organic materials.

The layer thicknesses for the layer pair of the acoustic mirror are adapted to the desired resonance frequency of the resonators and thereby the average frequency of the filter resulting therefrom. Because of the high bandwidth, a suitable layer pair of λ/4 or 3λ/4 layers can be used not only for a given resonance frequency but also with other frequencies that lie within the bandwidth of the mirror or with resonators with such resonance frequencies.

For the material of the lower electrode, the metals aluminum, tungsten, molybdenum and gold are suitable. Advantageously, a material with high acoustic impedance is used for the lower electrode layer.

For the piezoelectric layer, a material with a higher coupling constant is selected advantageously that can be deposited uniformly in the desired thickness, depending on the average frequency. Zinc oxide and aluminum nitride are especially suitable for BAW resonators. However, other piezoelectric materials are suitable in principle, to the extent that they meet the boundary conditions mentioned.

For the upper electrode layer, the same choice applies in principle as for the lower electrode layer. Each of the "lower" layers of a BAW resonator layer structure serves as a "substrate" for the layer applied onto it and withstand at least the conditions for depositing of the layer above it without damage, and it has only slight surface roughness so that no acoustic scatterings, losses, and growth disturbances appear that would reduce the dynamics of the resonators and thereby increase the insertion loss of the resulting filter.

In conventional acoustic mirrors with $SiO_2$ as the mirror layer with low acoustic impedance, the surface roughness of $SiO_2$ makes a polishing process (chemo-mechanical polishing, CMP, as a wet etching process, ion-radiation etching as a dry etching process) necessary before the lower electrode is deposited. One of the main reasons for the increased roughness of the uppermost $SiO_2$ layer of conventional acoustic mirrors is that the $SiO_2$ layers as low-impedance layers form the large surface roughnesses of the high-impedance layers (W, Mo, AlN) upward during deposition of the successive layers. Without this polishing step, the roughness appearing at the boundary between the lower electrode and the lower-impedance layer increases the acoustic losses in the resonators and thereby the insertion loss of the filter. Low-k dielectrics such as SiLK® and BCB, which are applied, e.g., by the spin-on technique onto a high-impedance layers such as tungsten, for example, smooth the roughnesses of the underlying layer through their flow properties. The surface roughness of the low-k dielectrics such as SiLK or BCB is itself extremely low after the hardening process of the layers. Typical RMS roughnesses are less than 1 nm. Other steps, such as costly and expensive polishing process to provide a homogeneous boundary are thus superfluous.

A BAW resonator or a stacked-crystal filter in a somewhat changed embodiment can be used as an impedance element for constructing a reactance filter, as is known, for example, from U.S. Pat. No. 5,910,756. Such a filter contains resonators connected in parallel and in series in a branching circuit, whereby the connection can be of the ladder type or the lattice type, for example. If the design rules for the reactance filters are also observed, a band-pass filter can be created in this way that has the required bandwidth for HF applications, in particular in current usual communications systems.

BAW resonators with an acoustic mirror, as described herein, already provide the increased bandwidth with respect to known resonators with conventional acoustic mirrors required for the individual resonators. This can be read directly from the admittance curve of the resonator, in which the distance between resonance and anti-resonance frequencies of the resonator represents a measurement of the bandwidth.

An advantageous application for a BAW resonator filter with an acoustic mirror is a duplexer. Such a duplexer comprises two band-pass filters, whose average frequencies are very close to each other and cover, for example, the transmitting and receiving bands of a communication system. The two band-pass filters of a duplexer must thus be tuned to each other such that each filter exhibits as high a level of attenuation as possible at the average frequency of the other filter. Depending on the required distance between the two average frequencies, it may also be required that the two facing flanks of the passage range of the two filters be set to be particularly steep. For such demands, high-quality filters are required that require high-value reactance filters, in the case of reactance filters. For this, for reactance filters comprised of BAW resonators, each resonance frequency has so far required its own acoustic mirror, adapted to the resonance frequency. With the aid of the acoustic mirror described herein, it is now possible to use an acoustic mirror comprised of only one pair of layers for both filters of a duplexer and thereby still meet the high requirements for flank steepness, bandwidths, and near selection. Only one substrate with a specific acoustic mirror applied over an entire surface is successfully realized for two filters working in closely adjacent frequency ranges. This simplifies production and thereby lowers costs. Because of reduced coupling through the acoustic mirror layers, it is also possible, with the acoustic mirror described herein, to expand the resonator further by applying the pair or pairs for the acoustic mirror to the entire surface and without additional structuring between individual resonators or individual filters.

DESCRIPTION OF THE DRAWINGS

FIG. 1*c* shows a cross-section of a filter having a middle electrode divided into two or more partial electrodes.

FIG. 6 shows the passage curves of a duplexer constructed from BAW resonators (curves 2) compared with the passage curves of a duplexer constructed from traditional BAW resonators (curves 1).

FIG. 7 shows the passage curves of a duplexer constructed from BAW resonators as a function of layer-thickness deviations of the low-k dielectric.

FIG. 8 shows the passage curves of a duplexer constructed of BAW resonators as a function of layer-thickness deviations of the high-impedance layer of the acoustic mirror.

DETAILED DESCRIPTION

Figure 1A:
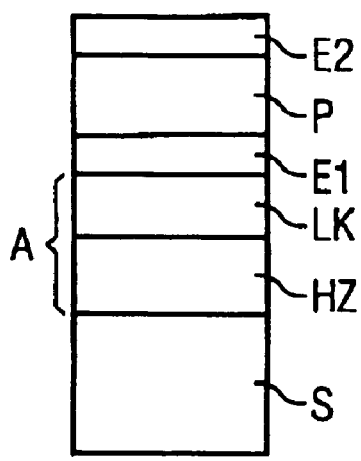
FIG. 1*a* shows, in a schematic section, a BAW resonator with an acoustic mirror.
Figure 1A:

FIG. 1*a* shows, in a schematic cross-section, a BAW resonator with an acoustic mirror, the mirror layers of which can be realized as $\lambda/4$ layers or $3\lambda/4$ layers independently of each other. Slight deviations from these conditions serve to enhance the resonator characteristics. Below the schematic cross-section, a substitute cross-section image of the BAW resonator is given. This is constructed on a substrate S that serves only as a mechanical solid carrier. Accordingly, the selection of materials suitable for it is broad. Directly onto the substrate, a first layer, HZ, with high acoustic impedance is applied, for example, a tungsten layer. This has an impedance of approximately $105 \times 10^6$ kg/sm². The thickness of layer HZ is selected in such a way that at the desired resonance frequency of the BAW resonator and the spreading rate of acoustic waves given in the material (tungsten) has a thickness of $\lambda/4$. For example, these can be a resonance frequency of 2.1 GHz and a thickness of 611 nm. Above layer HZ, a low-k dielectric is arranged with a thickness of $\lambda/4$ or a thickness of $3\lambda/4$, for example of a material sold by Dow Chemical Corporation under name SiLK®. The SiLK® material system includes cross-linked polyphenylenes, obtained by polymerization of monomers that can be substituted with cyclopentadienone and acetylene. The acoustically very similar material BCB includes crosslinked bis-benzocyclobutenone. When SiLK® or BCB is used, for example, the following mirror-layer thickness result: at a resonance frequency of 2.1 GHz, the mirror-layer thickness of a λ/4 wave is selected to be about 165 nm, and the mirror-layer thickness of a 3λ/4 layer is selected to about 500 nm.

With the given material combination, W/SiLK®, a broadband acoustic mirror, A, is realized that has a reflectivity for the acoustic energy of a wave of more than 95% at the average frequency mentioned. The acoustic mirror, A, can, however, also include additional layer pairs, thus additional layers with higher acoustic impedance, HZ, and additional layers with lower impedance, LK. These layers are arranged alternately in the desired number. Above the layer of low-k material, LK, is the lower electrode of the BAW resonator or an adhesion transmitter, diffusion barrier, or growth layers are formed, for example, by depositing CVD or spattering a molybdenum layer with a layer thickness of about 195 nm.

Above the lower electrode, E1, a piezoelectric layer, F, is now applied, for example a zinc-oxide layer. A spattering process is used, for example, as the application process. The piezoelectric layer, P, can, however, include other materials, for example aluminum nitride or another suitable piezoelectric material.

As the upper electrode of the BAW resonator, a second electrode layer, E2, is arranged above the piezoelectric layer P, not necessarily of the same material as the first electrode layer, E1. In many cases, the upper electrode E1 is also provided with tuning, trimming, or passivation layers.

The resonance frequency of the BAW resonator is determined approximately according to the formula $f=v/2L_0$, where $L_0$ is the layer thickness of the BAW resonator and is composed of the layer thicknesses of the piezoelectric layer P, and the two electrode layers, E1 and E2. For the primary oscillation mode of the BAW resonator, the thickness is set to λ/2. It is also possible to set the thickness d, to a multiple of λ/2 and accordingly stimulate higher oscillating modes. Besides the schematic cross-section, FIG. 1a also shows the electronic equivalent circuit diagram of a BAW resonator.

Figure 1B:
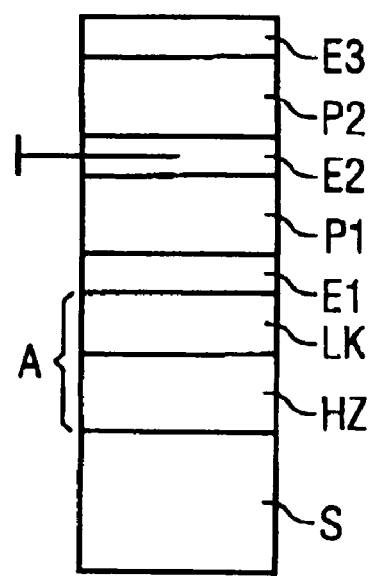
FIG. 1*b* shows in a schematic cross-section a stacked-crystal filter (SCF) with an acoustic mirror.
Figure 1B:

FIG. 1b shows, in a schematic cross-section, a stacked-crystal filter (SCF) with an acoustic mirror, the mirror layers of which can be realized as λ/4 or 3λ/4 layers, independently of each other. Slight deviations from these conditions serve to enhance the SCF characteristics. The SCF corresponds in its main structure to a BAW resonator that is coupled with a second resonator, electrically and acoustically. Below the schematic cross-section, an electronic equivalent circuit diagram for the SCF is given. Various examples and developments of SCFs are found in an article by K. M. Lakin et al.: "High Performance Stacked Crystal Filters for GPS and Wide Bandwidth Applications" in *IEEE* 2001 *Ultrasonics Symposium*, paper 3E-6, Oct. 9, 2001.

A SCF is, as described in the preceding paragraphs on FIG. 1a, first constructed like a BAW resonator. Similar materials, production techniques, and process sequences are used in this. Above electrode layer E2, which is deposited onto a piezoelectric layer, P1, for example by means of the spattering technique, a second piezoelectric layer, P2, is applied. This in turn is covered by an uppermost electrode, E3.

Referring to FIG. 1c, in an embodiment of the SCF, one or more acoustic mirror layers may be inserted between electrode E2a and another electrode E2b that may be deposited onto it, which layers change the electrical and the acoustical coupling between resonator E1-P1-E2a and resonator E2b-P2-E3. In these mirror layers that can be implemented as λ/4 or 3λ/4 layers, low-k dielectrics such as SiLK or BCB, for example, can be used as low-impedance layers. Below the schematic cross-sections of FIGS. 1a and 1b are electronic equivalent circuit diagrams of the SCFs.

Figure 2:
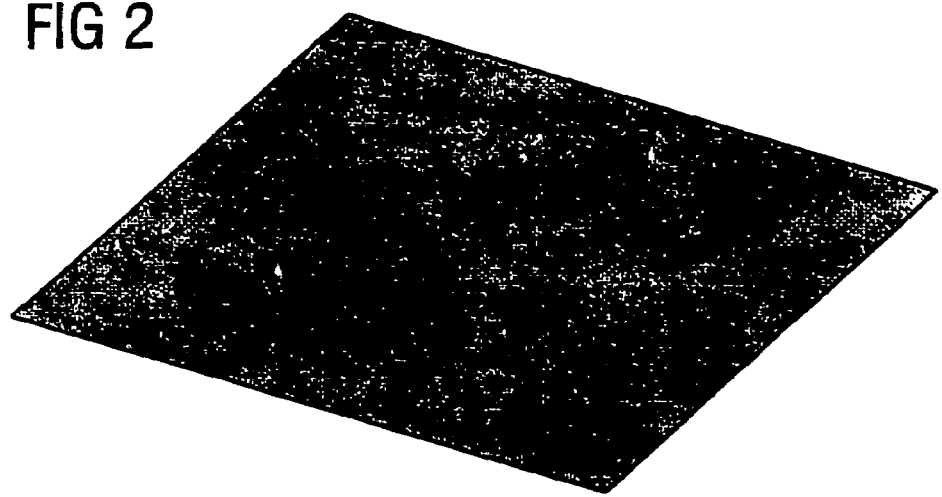
FIG. 2 shows an example of the surface topography of the low-k dielectric BCB created by means of raster power microscopy.

FIG. 2 shows an example of the surface topography of the low-k dielectric BCB, created via raster power microscopy on a field of 2 μm×2 μm. The photograph shows that the low-k dielectric, after hardening with RMS=0.28 nm has a very low surface roughness. This low value assures that subsequent layers, such as electrodes, can be grown undisturbed and that at the boundaries between the low-k dielectric and the electrodes no acoustic losses and scatterings appear that would reduce the dynamics of the resonators and thereby the increase the insertion loss of the filter. Low-k dielectrics, such as BCB or SiLK®, applied to the surface by the spin-on technique, also smooth the roughnesses of the layers below them by their flow properties. The boundary roughnesses, which can continue upward cumulatively in traditional mirrors, are not propagated upward with these low-k dielectrics. Steps such as the polishing of surfaces that may be necessary with conventional mirrors with $SiO_2$ as the uppermost low-impedance layer are thus made superfluous with the acoustic mirror described herein.

Figure 3:
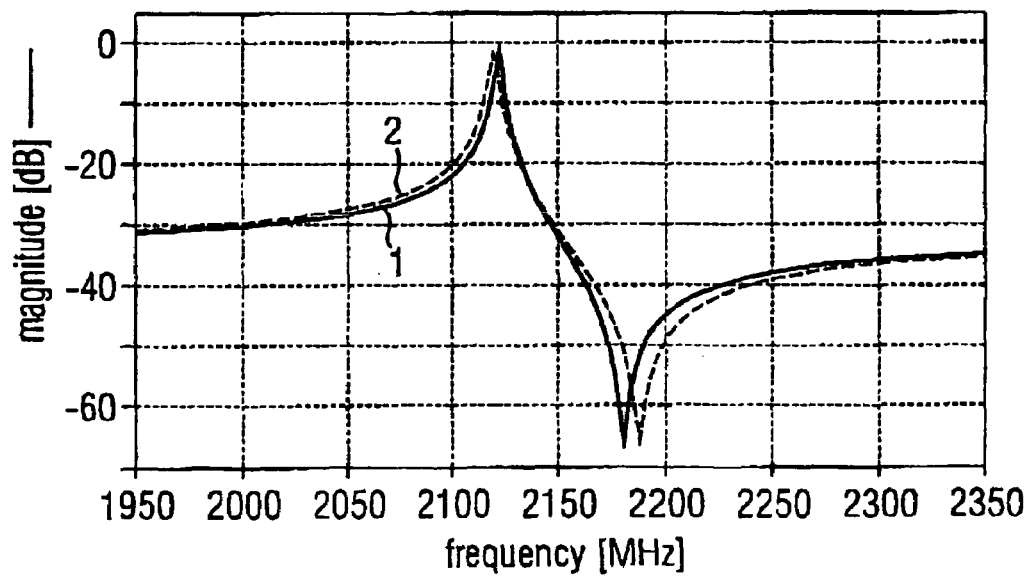
FIG. 3 shows the admittance curves of a BAW resonator compared with the admittance curve of a traditional resonator.

FIG. 3 shows the admittance curve of a BAW resonator provided with an acoustic mirror A. Its curve 2 is compared with a curve 1 that is determined with a traditional BAW resonator with a traditional acoustic mirror. This known acoustic mirror is constructed of two λ/4 layer pairs of $SiO_2$/W. It is shown in the diagram that with the resonator described herein, a higher bandwidth is obtained than with the resonator with a traditional mirror. The bandwidth results from the distance between the resonance frequency $f_r$ and the anti-resonance frequency $f_a$. Having a broad band produces a band-pass filter with increased bandwidth. An increased bandwidth of 9.4 MHZ results from FIG. 3. In contrast to the bandwidth, 57.5 MHz, of a BAW resonator with a conventional mirror, this means a bandwidth increase of 16%. The admittance curves shown correspond to BAW resonators with gold and aluminum as electrodes. Silicon serves as the substrate. The improved characteristics of the resonators described herein are attributed especially to the favorable properties of the low-k dielectric layer, LK, which, in contrast to the silicon dioxide used so far for this, has significantly improved parameters. The following table gives an overview of characteristics of the known material ($SiO_2$) and the polyaromatic compound SiLK® used herein:

|  | $SiO_2$ | SiLK® |
|---|---|---|
| Density | 2.2 g/cm$^3$ | <2.0 g/cm$^3$ |
| Elastic constant | 7.8 × 10$^{10}$ Pa | <0.27 × 10$^{10}$ Pa |
| Relative dielectric constant | 4 | 2.65 |
| Acoustic impedance | 13 × 10$^6$ kg/sm$^2$ | <2.3 × 10$^6$ km/sm$^2$ |

Figure 4A:
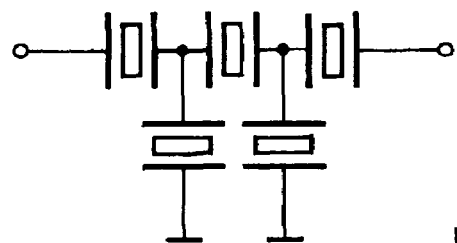
FIG. 4*a* shows an example of a possible structure of a reactance filter in a ladder-type structure.
Figure 4B:
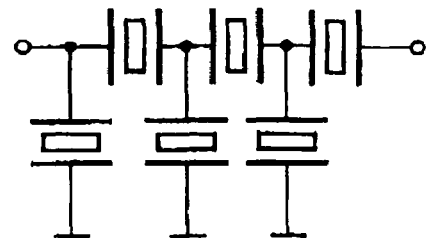
FIG. 4*b* shows an example of another possible structure of a reactance filter in a ladder-type structure.

FIG. 4 shows three examples of possibilities of how a reactance filter can be constructed of several BAW resonators. In the ladder-type structures of FIG. 4a and FIG. 4b, at least one resonator $R_s$ is connected in series between the filter input and the filter output. In parallel to this, at least one additional resonator $R_p$ is connected to ground. The resonance frequency of the resonator $R_s$ connected in the serial arm is selected in this case in such a way that the anti-resonance frequency of the resonator $R_f$ is approximately equal to the anti-resonance frequency of the resonator, $R_F$ in the parallel branch of the filter: $f_{sp}=f_{rs}$.

Advantageously, a reactance filter includes a ladder-type structure, in which several BAW resonators, $R_{s1}$, $R_{s2}$, and $R_{s3}$ connected in series and several resonators $R_{p1}$, $R_{p2}$, connected in parallel, are connected to one another as shown. Beginning at one input or output, the structure can be abbreviated with the letters p for parallel resonator, $R_p$, or with s for serial resonator, $R_s$. In FIG. 4a, an s-p-s-p-s structure is shown with five resonators, while in FIG. 4b a p-s-p-s-p-s structure is shown with six resonators.

The ladder-type structure can be expanded with an arbitrary number of additional serial and parallel resonators, whereby each parallel resonator, $R_p$, can be composed of two parallel resonators connected in parallel and each serial resonator, $R_s$ can be composed of two resonators connected in series. The known design rules for ladder-type filters can be applied.

Figure 4C:
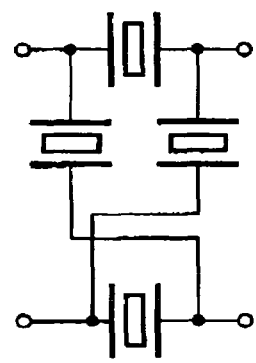
FIG. 4*c* shows an example of a possible structure of a reactance filter in a lattice structure.

FIG. 4c shows the lattice-type structure of a reactance filter constructed of BAW resonators. This structure will be used advantageously for the so-called balanced-balanced mode of filters.

Figure 5:
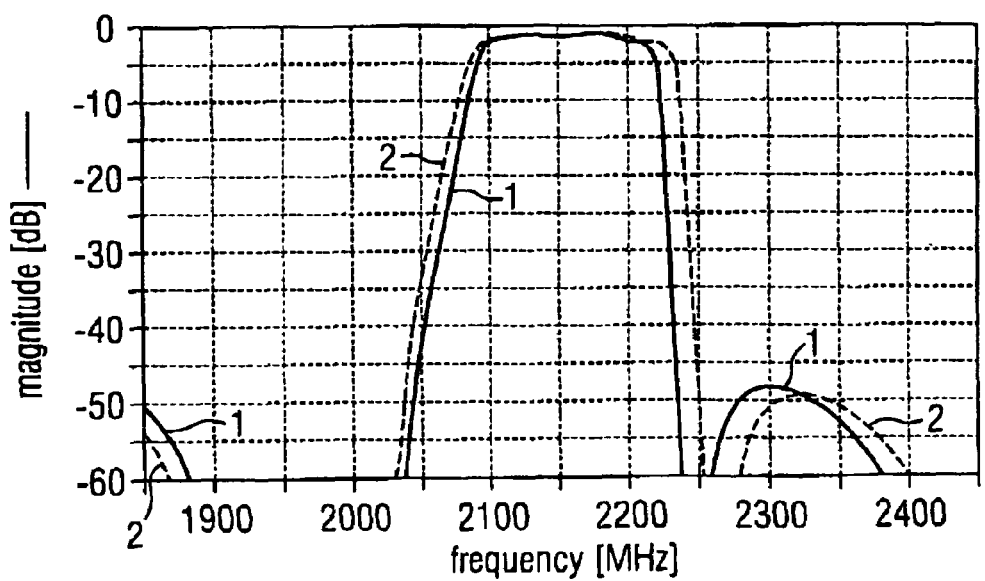
FIG. 5 shows an example of the passage curve of a reactance filter constructed from a BAW resonator compared with a reactance filter constructed from traditional BAW resonators.

FIG. 5 shows the passage behavior of a band-pass filter constructed from BAW resonators described herein. Passage curve 2 of the BAW resonator is compared here to a passage curve 1 determined with a filter with traditional BAW resonators. As a comparison to this, BAW resonators with an acoustic mirror of two λ/4 layer pairs of $SiO_2$/W are again brought in. It is shown that the new kind of filter has, in contrast to a traditional filter, an increased bandwidth with at least as good insertion loss and equally good blocking-range suppression. The bandwidth increases by 14%, for example. The insertion loss practically does not change. In this way, it is possible to use zinc oxide instead of aluminum nitride, which, because of its lower coupling, otherwise has a lower bandwidth. The effect of otherwise equal specifications can be compensated for, through the relative increase in bandwidth, when a mirror as described herein is used. Likewise, it is possible with the acoustic mirror to compensate for a lower quality of the piezoelectric layer P caused by the bandwidth reduction.

By increasing the boundary reflection and the bandwidth of the acoustic mirror described herein, a certain thickness tolerance also results for the thickness of λ/4 and 3λ/4 layers. Thus it is possible to use one and the same layer thickness for the acoustic mirror layers of two different filters, the resonance frequencies of which lie near to each other, for example a duplexer with an RX filter and a TX filter for the UMTS 3G standard.

FIG. 6 shows the passage curves for RX and TX filters of a UMTS duplexer, where in the diagram the curves for a duplexer with the BAW resonators described herein are contrasted with the filter curves of traditional BAW resonators. While for curve 1 with the conventional acoustic mirror, the λ/4 layers are optimized separately for RX and TX filters and set to different layer heights. For duplexers that include the BAW resonators according to passage curve 2, a more uniform acoustic mirror is used with average layer thickness optimized for the λ/4 layers, for example, the optimal layer thickness optimized for one of the average frequencies of the RX filters. It will be recognized that, in spite of this simplification, both TX and RX filters satisfy the specifications given in advance. In the diagram, the limit values to be observed are shown in the form of horizontal bars, in the passage range below the curve, in the blocking range above the curve. The simplified production of a UMTS duplexer with a uniform acoustic mirror is possible since the mirror with only a λ/4 layer pair has constant reflection properties over a larger frequency range that a conventional mirror does. This contributes in the end to the broad bandwidth of the mirror described herein, which makes possible the production of RX filters and TX filters of duplexers on a single substrate with identical mirrors or with a uniform mirror. With this, the process complexity and the production costs are reduced significantly. In spite of the uniform or identical mirror-layer thickness for RX and TX filters, the bandwidth increases here, too: by 13% for TX filters and by 14% for RX filters. While the TX filter has a ladder-type structure as illustrated in FIG. 4a, the RX filter has an additional parallel resonator, $R_p$, at the input.

In another experiment, the dependency of filter characteristics on variations in layer thicknesses within the acoustic mirror described herein was determined. For this, with the RX/TX filter pair already described for a UMTS duplexer with an acoustic mirror described herein, the layer thickness of the low-k dielectric (here: SiLK®) was varied from the optimal value (here: 165 nm) by ±13 nm. FIG. 7 shows the two curves, each with nonoptimal layer thicknesses, where the deviation is still ±7.8% of the target value, 165 nm. It is shown that the two nonoptimal layer thicknesses of the mirror layer mentioned still lead to band-pass filters that just meet the specifications given in advance. This shows that with the acoustic mirror described herein, relative layer-thickness variations in the individual mirror layers of about ±7% are permitted. With this, the permitted layer-thickness variation is significantly higher than the maximum with the commercial SiLK material (according to the manufacturer's specifications, a layer-thickness precision of less than 0.5% is possible for deposition in the SOD technique).

In FIG. 8, the layer thickness of the first high-impedance mirror layer (here: tungsten) is varied to deviate from the optimal value (here: 611 nm) by ±300 nm. The two passage curves, each with nonoptimal layer thicknesses, as can be seen in FIG. 8, are nearly indistinguishable, although the layer-thickness deviation for the tungsten λ/4 layer amounts to nearly ±50%. In spite of the high layer-thickness deviation in the mirror layer mentioned, the passage curves lead to band-pass filters that fulfill the specifications given in advance. This high tolerance in the passage curves of deviations in the layer-thickness variations in the high-impedance layer when low-k dielectrics such as SiLK or BCB are used, for example, can be attributed to the fact that the predominant part of the acoustic waves is already reflected at the boundary between the lower electrode and the low-k dielectric (for example: over 90% reflection). The influence of variations in materials and geometry of lower layers on the position and shape of admittance curves of the resonators and on passage curves of the filter is strongly reduced. Because of the higher tolerance for layer-thickness variations, simpler application processes are also possible, which further lowers the costs for the acoustic mirrors.

Although the embodiments above been described on the basis of just a few optimal combinations of materials, other materials may also be used. If a deviation is made from the mentioned low-k organic dielectrics that bring with them the optimal conditions for the acoustic mirror, then more than one layer pair of λ/4 and 3λ/4 layers can be used for an acoustic mirror. This also applies when a deviation is made from using tungsten as the material for the layer with higher acoustic impedance and a transition is made to molybdenum or aluminum nitride is made, for example. In the acoustic mirror, the number of mirror layers required is reduced. This, in turn, reduces the interrupting electric coupling to the substrate and in all cases simplifies production of the mirror, which now no longer needs any structuring. By using acoustic mirrors, one obtains a higher degree of freedom in the selection of desired materials, which makes possible further optimization of BAW resonators and filters resulting from them. In doing so, the minimum characteristics of conventional BAW resonators are achieved, but for optimal layer combinations they are significantly exceeded, as illustrated.

The invention claimed is:

1. An acoustic mirror comprising:
constituent layers comprising a layer having a thickness of substantially an odd multiple of $\lambda/4$, where $\lambda$ corresponds to a length of an acoustic wave, the constituent layers comprising a single pair of layers, the single pair of layers comprising a first impedance layer and a second impedance layer,
the first impedance layer comprising a first material having a first acoustic impedance and a first dielectric constant, the first material comprising at least one of aluminum nitride, gallium nitride, and zinc oxide,
the second impedance layer comprising a second material having a second acoustic impedance and a second dielectric constant, the second material comprising a polymerized benzocyclobutene,
the first acoustic impedance being higher than the second acoustic impedance, and
the first dielectric constant being higher than the second dielectric constant.

2. The acoustic mirror of claim 1, wherein the acoustic mirror is on a top layer of a bulk acoustic wave resonator (BAW) resonator or a stacked-crystal filter, the acoustic mirror comprising an initial layer of the second material followed by a layer of the first material deposited on the layer of the second material.

3. The acoustic mirror of claim 1, wherein at least one of the constituent layers is substantially $3\lambda/4$.

4. The acoustic mirror of claim 1, wherein the second material has a density of at least 2.4 g/cm$^2$, an elastic constant with a value of less than 10 Gpa, and a dielectric constant of less than 3.

5. The acoustic mirror of claim 1, wherein the second material has nanopores.

6. The acoustic mirror of claim 1, wherein the second impedance layer is above the first impedance layer relative to a substrate that holds the acoustic mirror.

7. The acoustic mirror of claim 1, wherein the first material is gallium nitride.

8. The acoustic mirror of claim 1, wherein the first material is zinc oxide.

9. A duplexer comprising filters, the filters comprising first and second BAW resonators, each of the first and second BAW resonators comprising:
a substrate;
a first impedance layer comprising a first material having a first acoustic impedance and a first dielectric constant, the first material comprising at least one of aluminum nitride, gallium nitride, and zinc oxide;
a second impedance layer comprising a second material having a second acoustic impedance and a second dielectric constant, the second material comprising a polymerized benzocyclobutene;
the first acoustic impedance being higher than the second acoustic impedance, and
the first dielectric constant being higher than the second dielectric constant;
electrode layers that are above the second impedance layer relative to the substrate; and
a piezoelectric layer between the electrode layers.

10. The duplexer of claim 9, wherein the electrode layers comprise at least one of Al, W, Mo, Cu, and Au.

11. The duplexer of claim 9, wherein the second impedance layer is above the first impedance layer relative to the substrate.

12. The duplexer of claim 9, wherein the piezoelectric layer is one of plural piezoelectric layers between the electrode layers, each of the plural piezoelectric layers comprising at least one of zinc oxide, aluminum nitride, gallium nitride, and other piezoelectric materials.

13. The duplexer of claim 9, wherein the electrode layers comprise a first electrode and a second electrode, the second electrode being split into two partial electrodes; and
wherein the duplexer further comprises at least one additional layer located between the two partial electrodes, the at least one additional layer comprising a layer that is substantially $\lambda/4$ and that has a dielectric constant that is less than the first dielectric constant.

14. The duplexer of claim 9, wherein the first and second BAW resaonators are connected in serial and parallel relationships.

15. The duplexer of claim 9, wherein the first and second BAW resonators are connected in a lattice structure.

16. The duplexer of claim 9, wherein each substantially odd multiple of $\lambda/4$ comprises either $\lambda/4$ or $3\lambda/4$.

17. The duplexer of claim 9, wherein the first and second BAW resonators are over a common acoustic mirror.

18. The duplexer of claim 17, wherein the common acoustic mirror is formed over a substrate under the first and second BAW resonators.

19. The duplexer of claim 9, wherein the electrode layers comprise at least one of Al, W, Cu, and Au.

20. The duplexer of claim 9, wherein the piezoelectric layer comprises at least one of zinc oxide, aluminum nitride, gallium nitride, and other piezoelectric materials.

* * * * *